United States Patent
Lee et al.

(10) Patent No.: US 10,777,927 B2
(45) Date of Patent: Sep. 15, 2020

(54) ELECTRONIC DEVICE HAVING FLEXIBLE CONNECTOR

(71) Applicant: Samsung Electronics Co., Ltd., Gyeonggi-do (KR)

(72) Inventors: Sung-Hyup Lee, Gyeonggi-do (KR); Jong-Su Youn, Gyeonggi-do (KR); Jung-Suk Woo, Gyeonggi-do (KR); Hyung-Jae Lee, Yongin-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/334,055

(22) PCT Filed: Aug. 29, 2017

(86) PCT No.: PCT/KR2017/009447
§ 371 (c)(1),
(2) Date: Mar. 18, 2019

(87) PCT Pub. No.: WO2018/066817
PCT Pub. Date: Apr. 12, 2018

(65) Prior Publication Data
US 2019/0273336 A1 Sep. 5, 2019

(30) Foreign Application Priority Data
Oct. 5, 2016 (KR) .......................... 10-2016-0128412

(51) Int. Cl.
*H01R 13/24* (2006.01)
*H05K 7/14* (2006.01)
(Continued)

(52) U.S. Cl.
CPC ............. *H01R 13/24* (2013.01); *G06F 3/041* (2013.01); *H01R 4/58* (2013.01); *H01R 12/712* (2013.01);
(Continued)

(58) Field of Classification Search
CPC .. H01R 13/24; H01R 12/716; H01R 13/2442; H01R 4/58; H01R 12/712; H01R 13/518;
(Continued)

(56) References Cited

U.S. PATENT DOCUMENTS 7,611,391 B2 * 11/2009 Long ................... H01R 13/2442
439/500
9,729,686 B2 * 8/2017 Chung ................. H04M 1/0277
(Continued)

FOREIGN PATENT DOCUMENTS

JP 2005-293989 A 10/2005
KR 10-2013-0073197 A 7/2013
(Continued)

*Primary Examiner* — Rockshana D Chowdhury
(74) *Attorney, Agent, or Firm* — Cha & Reiter, LLC.

(57) ABSTRACT

An electronic device according to an embodiment of the present invention may comprise: a housing comprising a first surface, a second surface facing in the opposite direction to the first surface, and a side surface surrounding the space between the first surface and the second surface; a touch screen display exposed through the first surface; a printed circuit board (PCB) which comprises at least one conductive path, which is arranged between the touch screen display and the second surface, and which comprises a least one conductive path; and a flexible connector arranged to provide an electric connection between the at least one conductive path and at least a part of the side surface. At least a part of the side surface of the housing is made of an electrically conductive material.

15 Claims, 11 Drawing Sheets

(51) Int. Cl.
  *G06F 3/041*   (2006.01)
  *H05K 5/03*    (2006.01)
  *H01R 4/58*    (2006.01)
  *H01R 12/71*   (2011.01)
  *H01R 13/518*  (2006.01)
  *H04M 1/02*    (2006.01)
  *H01R 101/00*  (2006.01)

(52) U.S. Cl.
  CPC ....... *H01R 12/716* (2013.01); *H01R 13/2442* (2013.01); *H01R 13/518* (2013.01); *H04M 1/0202* (2013.01); *H05K 5/03* (2013.01); *H05K 7/1427* (2013.01); *H01R 2101/00* (2013.01)

(58) Field of Classification Search
  CPC ............ H01R 2101/00; H04M 1/0202; H04M 1/0274; G06F 3/041; G06F 1/1698; H05K 5/03; H05K 7/1427
  See application file for complete search history.

(56) References Cited

U.S. PATENT DOCUMENTS

2014/0268590 A1* 9/2014 Kim ................. B05D 3/067
                                              361/748
2015/0173245 A1  6/2015 Chung et al.
2015/0295330 A1 10/2015 Chen et al.

FOREIGN PATENT DOCUMENTS

| KR | 10-1499187 B1    | 3/2015 |
| KR | 10-2015-0045180 A | 4/2015 |
| KR | 10-2015-0071619 A | 6/2015 |

\* cited by examiner

ELECTRONIC DEVICE HAVING FLEXIBLE CONNECTOR

CROSS-REFERENCE TO RELATED APPLICATION(S)

This application is a National Phase Entry of PCT International Application No. PCT/KR2017/009447, which was filed on Aug. 29, 2017, and claims priority to Korean Patent Application No. 10-2016-0128412, which was filed on Oct. 5, 2016, the content of each of which are incorporated herein by reference.

TECHNICAL FIELD

The present disclosure relates to an electronic device including a flexible connector in which a separation distance between components in an electronic device is ensured.

BACKGROUND ART

Recently, portable mobile devices have been developed at a rapid pace, and as the spread of the portable mobile devices has expanded, people more frequently use and are in contact with portable mobile devices in their daily lives.

Generally, a portable terminal, such as a PCS, a PDA, a GPS, a notebook computer, a DMB, a cellular phone, or a mobile phone, is equipped with an antenna for the purpose of transmitting/receiving radio signals. Such an antenna feeds a received signal to a printed circuit board on which various electronic components are mounted. In order to feed the signal to the printed circuit board in this way, an antenna contact device connects the antenna and the printed circuit board.

DETAILED DESCRIPTION OF THE INVENTION

Technical Problem

In an antenna contact method using an existing antenna contact device, an antenna region is expanded from a side metal region to a rear region using a flange, and then a contact device in the form of a clip is used in a printed circuit board region (an RF signal portion) as a structure for bringing the flange and the printed circuit board region into contact with each other.

However, the existing antenna contact device has a problem in that the separation distance between a display and a surrounding structure is not ensured in a new electronic device in which a display region tends to expand, and thus ensured antenna performance is significantly lowered. For example, when an overlap between the antenna and the display occurs, the current flowing through the antenna may be absorbed into the display, which may make it impossible to ensure normal radiation performance.

The present disclosure provides an electronic device including a flexible connector, in which a device configured to stably maintain the contact point between the antenna and the printed circuit board is disposed at an end of a printed circuit board in order to ensure that the flexible connector does not overlap an expanded display.

In addition, the present disclosure provides an electronic device including a flexible connector, in which a device having at least two contact points is provided to be simultaneously brought into contact with an antenna (ANT) contact portion and an antenna (ANT) tuning portion.

Technical Solution

According to an embodiment of the present disclosure, an electronic device may include: a first housing including a first surface, a second surface facing away from the first surface, and a side surface surrounding a space between the first surface and the second surface, at least a portion of the side surface being formed of an electrically conductive material and the first surface having a substantially rectangular shape when viewed from above, in which the rectangular shape includes a first periphery extending in a first direction and having a first length, a second periphery extending in a second direction perpendicular to the first direction and having a second length longer than the first length, a third periphery extending in the first direction and having the first length, and a fourth periphery extending in the second direction and having the second length;
a touch screen display exposed through the first surface and including a first side extending in the first direction along the first periphery of the first surface;
a printed circuit board disposed between the touch screen display and the second surface, and having at least one conductive path; and
a flexible connector disposed to provide an electrical connection between the at least one conductive path and at least a portion of the side surface, wherein the connector may include a first conductive portion configured to be movable in the second direction and disposed to be in electrical contact with the at least a portion of the side surface, and a second conductive portion configured to be movable in the third direction perpendicular to the first direction and the second direction.

Advantageous Effects

An electronic device including a flexible connector, according to the present disclosure, is provided with a flexible connector spaced apart from a display so as not to overlap an expanded display. Thus, it is possible to suppress current interference due to the overlap and to stably maintain the contact point between an antenna and a printed circuit board.

In addition, an electronic device including a flexible connector, according to the present disclosure, includes a flexible connector having at least two contact points configured to simultaneously come into contact with an antenna contact portion and an antenna tuning portion, and an elastic member is provided in each contact portion. Thus, it is possible to maintain stable contact performance that is not released even if the contact portion shakes.

MODE FOR CARRYING OUT THE INVENTION

Figure 1:
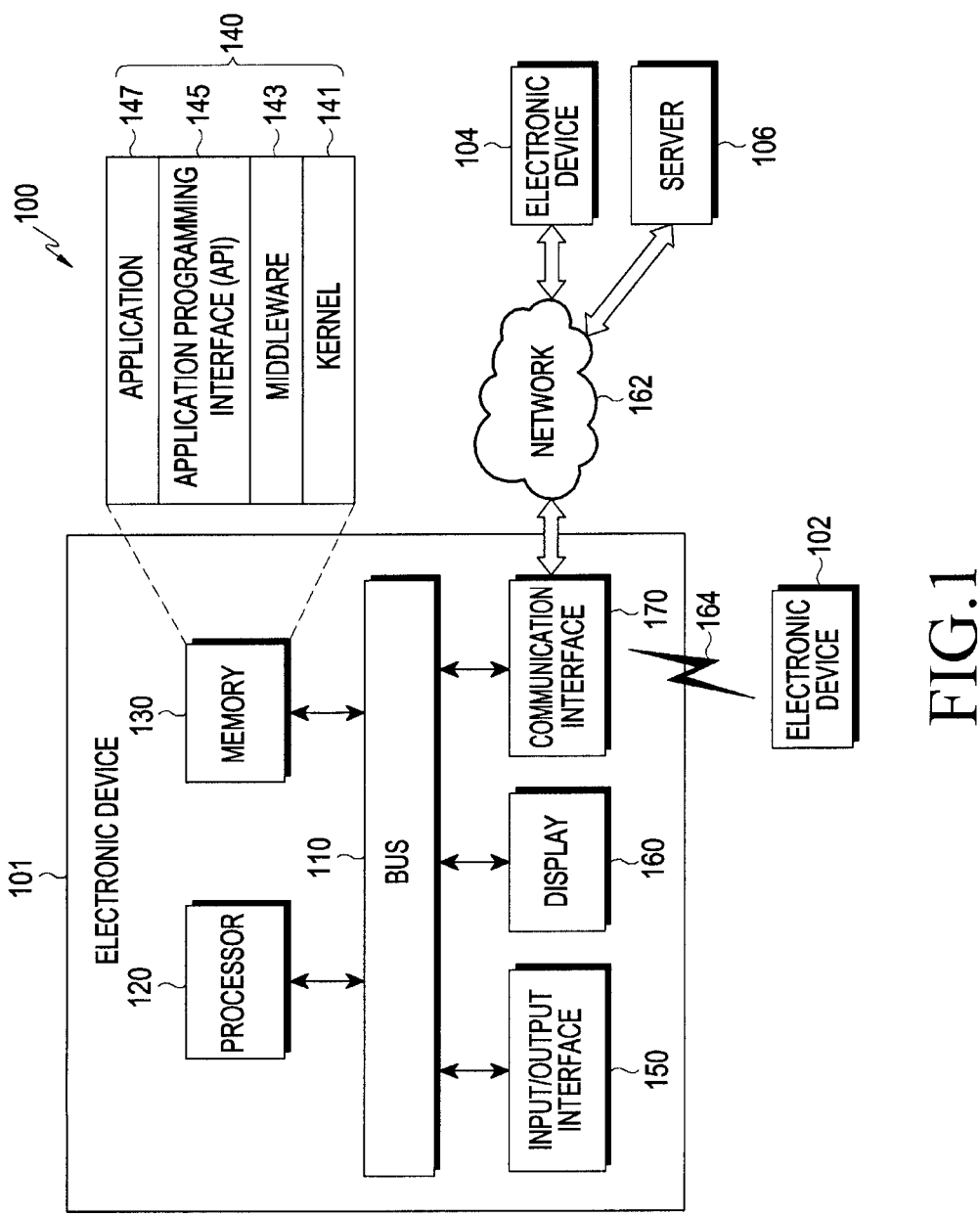
FIG. 1 is a view illustrating an electronic device within a network environment according to various embodiments.

Hereinafter, various embodiments of the present disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar constituent elements. A singular expression may include a plural expression unless they are definitely different in a context. As used herein, singular forms may include plural forms as well unless the context clearly indicates otherwise. The expression "a first", "a second", "the first", or "the second" used in various embodiments of the present disclosure may modify various components regardless of the order and/or the importance but does not limit the corresponding components. When an element (e.g., first element) is referred to as being "(functionally or communicatively) connected," or "directly coupled" to another element (second element), the element may be connected directly to the another element or connected to the another element through yet another element (e.g., third element).

The expression "configured to" as used in various embodiments of the present disclosure may be interchangeably used with, for example, "suitable for", "having the capacity to", "designed to", "adapted to", "made to", or "capable of" in terms of hardware or software, according to circumstances. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device. According to various embodiments, the wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable type (e.g., an implantable circuit). In some embodiments, the electronic device may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™, a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.). According to some embodiments, an electronic device may include at least one of a part of furniture or a building/structure, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to embodiments of the present disclosure is not limited to the above-described devices. In the present disclosure, the term "user" may indicate a person using an electronic device or a device (e.g., an artificial intelligence electronic device) using an electronic device.

An electronic device 101 within the network environment 100, in various embodiments, will be described with reference to FIG. 1. The electronic device 101 may include a bus 110, a processor 120, a memory 130, an input/output interface 150, a display 160, and a communication interface 170. In a certain embodiment, at least one of the above-mentioned components may be omitted from the electronic device 101 or the electronic device 101 may additionally include other components. The bus 110 may include a circuit that interconnects the above-mentioned components 110 to 170 and transfers communication information (e.g., a control message or data) among the components 110 to 170. The processor 120 may include one or more of a Central Processing Unit (CPU), an Application Processor (AP), and a Communication Processor (CP). The processor 120 may execute, for example, an arithmetic operation or data processing that is related to a control and/or communication of one or more other components of the electronic device 101.

The memory 130 may include a volatile memory and/or a non-volatile memory. The memory 130 may store, for example, commands or data that are related to one or more other components of the electronic device 101. According to one embodiment, the memory 130 may store software and/or a program 140. The program 140 may include, for example, kernel 141, middleware 143, an Application Programming Interface (API) 145, and/or an application 147. At least one of the kernel 141, the middleware 143, and the API 145 may be referred to as an Operating System (OS). The kernel 141 may control or manage, for example, system resources (e.g., the bus 110, the processor 120, and the memory 130) that are used for executing operations or functions implemented in the other programs (e.g., the middleware 143, the API 145, or the application 147). In addition, the kernel 141 may provide an interface that allows the middleware 143, the API 145, or the application 147 to access individual components of the electronic device 101 so as to control or manage the system resources.

The middleware 143 may play an intermediary role such that, for example, the API 145 or the application 147 may communicate with the kernel 141 so as to exchange data. In addition, the middleware 143 may process one or more task requests which are received from the applications 147, according to a priority. For example, the middleware 143 may assign the priority of the ability to use a system resource of the electronic device 101 (e.g., the bus 110, the processor 120, or the memory 130) to at least one of the applications 147, and may process the one or more task requests. The API 145 is, for example, an interface that allows the applications 147 to control functions provided from the kernel 141 or the middleware 143, and may include, for example, one or more interfaces or functions (e.g., commands) for a file control, a window control, an image processing, or a character control. The input/output interface 150 may transmit commands or data, which are entered from, for example, a user or any other external device, to the other component(s) of the electronic device 101, or may output commands or data, which are received from the other component(s) of the electronic device 101, to the user or the other external device.

The display device 160 may include, for example, a Liquid Crystal Display (LCD), a Light Emitting Diode (LED) display, an Organic Light Emitting Diode (OLED) display, a MicroElectroMechanical System (MEMS), or an electronic paper display. The display 160 may display various contents (e.g., text, image, video, icon, or symbol) to, for example, the user. The display 160 may include a touch screen, and may receive a touch input, a gesture input, a proximity input, or a hovering input that is made using, for example, an electronic pen or a part of the user's body. The communication interface 170 may set, for example, communication between the electronic device 101 and an external device (e.g., a first external electronic device 102, a second external device 104, or a server 106). For example, the communication interface 170 may be connected with a network 162 through wired or wireless communication so as to communicate with the external device (e.g., the second external electronic device 104 or the server 106).

The wireless communication may include a cellular communication that uses at least one of, for example, Long-Term Evolution (LTE), LTE Advance (LTE-A), Code Division Multiple Access (CDMA), Wideband CDMA (WCDMA), Universal Mobile Telecommunication System (UMTS), Wireless Broadband (WiBro), and Global System for Mobile communication (GSM). According to one embodiment, the wireless communication may include at least one of, for example, Wi-Fi, Bluetooth, Bluetooth Low Energy (BLE), ZigBee, Near Field Communication (NFC), Magnetic Secure Transmission, Radio Frequency (RF), and Body Area Network (BAN). According to one embodiment, the wireless communication may include GNSS. The GNSS may include, for example, at least one of Global Positioning System (GPS), Global Navigation Satellite System (Glonass), Beidou Navigation Satellite System (hereinafter, "Beidou"), Galileo, and the European global satellite-based navigation system, according to, for example, a use area or band width. Herein, "GPS" may be interchangeably used with "GNSS" below. The wired communication may use at least one of, for example, Universal Serial Bus (USB), High Definition Multimedia Interface (HDMI), Recommended Standard 232 (RS-232), power line communication, and Plain Old Telephone Service (POTS). The network 162 may include a telecommunication network (e.g., at least one of a computer network (e.g., LAN or WAN), the internet, and a telephone network).

Each of the first and second external electronic devices 102 and 104 may be the same type as or different from the electronic device 101. According to various embodiments, all or some of the operations to be executed by the electronic device 101 may be executed in another electronic device or a plurality of other electronic devices (e.g., the electronic devices 102 and 104 or the server 106). According to one embodiment, in the case where the electronic device 101 should perform a certain function or service automatically or by a request, the electronic device 101 may request some functions or services that are associated therewith from the other electronic devices (e.g., the electronic devices 102 and 104 or the server 106), instead of, or in addition to, executing the functions or service by itself. The other electronic devices (e.g., the electronic devices 102 and 104 or the server 106) may execute the requested functions or additional functions, and may deliver the results to the electronic device 101. The electronic device 101 may provide the requested functions or services by processing the received results as they are or additionally. For this purpose, for example, cloud computing technology, distributed computing technology, or client-server computing technology may be used.

Figure 2A:
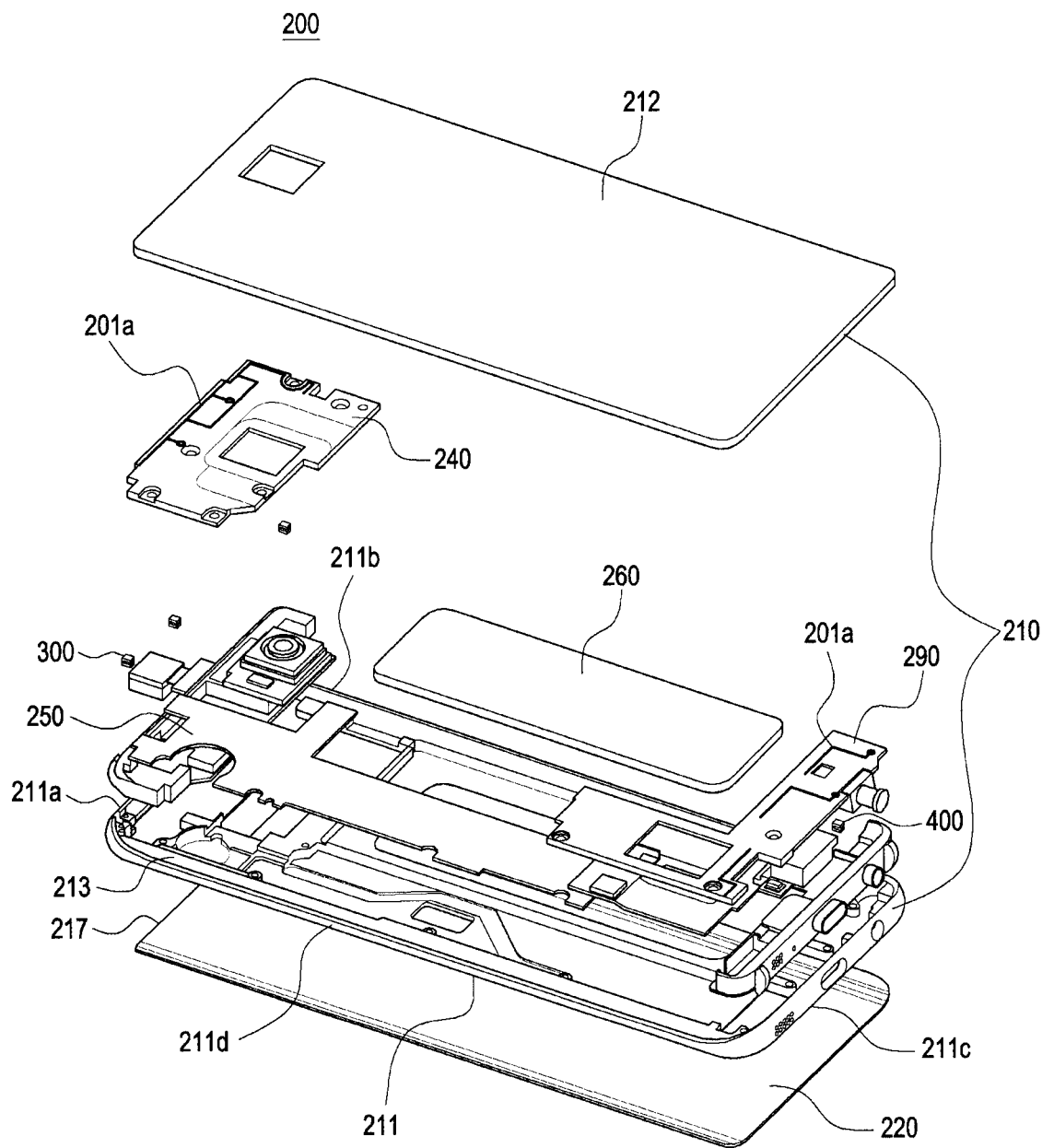
FIG. 2A is an exploded perspective view illustrating an electronic device according to one of various embodiments of the present disclosure.
Figure 2B:
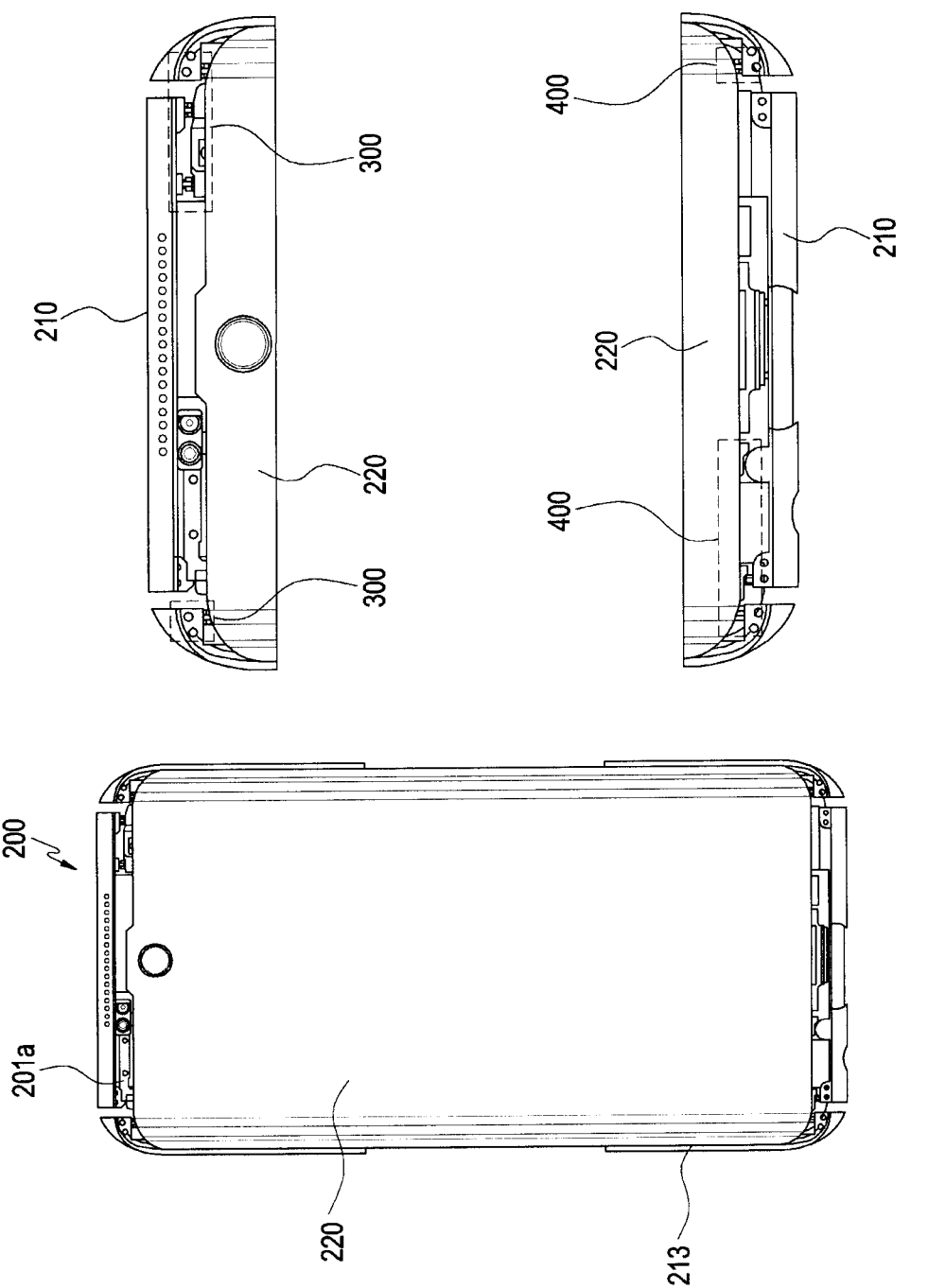
FIG. 2B is a front view illustrating an arrangement relationship between flexible connectors in an electronic device according to one of various embodiments of the present disclosure.

FIG. 2A is an exploded perspective view plan view illustrating an electronic device 200 according to various embodiments of the present disclosure in a partially disassembled state. FIG. 2B is a front view illustrating an arrangement relationship between flexible connectors 300 and 400 in an electronic device 200 according to one of various embodiments of the present disclosure. The electronic device 200 of FIGS. 2A and 2B may be the electronic device 101 of FIG. 1.

In FIG. 2A, the "X-axis" in an orthogonal coordinate system of three axes may correspond to the width direction of the electronic device 200, the "Y-axis" may correspond to the length direction of the electronic device 200, and the "Z-axis" may correspond to the thickness direction of the electronic device 200. In an embodiment of the present disclosure, the "X-axis direction" may be referred to as a first direction (+X, −X), and the "Y-axis direction" may be referred to as a second direction (+Y, −Y), and the "Z-axis direction" may be referred to as a third direction (+Z, −Z).

Referring to FIGS. 2A and 2B, the electronic device 200 may include a housing 210, a display device 220, at least one printed circuit board 250, and one or more flexible connectors 300 and 400.

According to various embodiments, the housing 210 is configured to accommodate various electronic components and the like, and at least a portion of the housing 110 may be made of an electrically conductive material. For example, the housing 210 may include sidewalls forming the outer surface of the electronic device 200. Alternatively, a portion of the housing 210, which is exposed as the exterior of the electronic device 200, may include an electrically conductive material. Within the housing 210, the printed circuit board 250 and/or a battery 260 may be accommodated. For example, a processor, a communication module, various interfaces (e.g., the interfaces 150 and 170 in FIG. 1), a power management module, and a control circuit may be disposed on the printed circuit board 250. Alternatively, a processor, a communication module, various interfaces (e.g., the interfaces 150 and 170 in FIG. 1), a power management module, or a control circuit may be configured in the form of an integrated circuit chip to be mounted on the printed circuit board 250. For example, the control circuit may be a portion of the above-described processor or communication module.

According to various embodiments, the housing 210 may include a first surface 211, and a second surface 212 disposed to be spaced apart from and to face away from the first surface 211. The housing 210 may include a side surface 213 surrounding a space between the first surface 211 and the second surface 212, and at least a portion of the side surface 213 may include an electrically conductive material.

According to various embodiments, when viewed from above, the first surface 211, the first surface 211 may have a substantially rectangular shape. The rectangular first surface 211 may include: a first periphery 211a extending in the first direction (+X, −X) and having a first length; a second periphery 211b extending in the second direction (+Y, −Y) perpendicular to the first direction (+X, −X) and having a second length longer than the first length; a third periphery 211c extending in the first direction (+X, −X) and having the first length; and a fourth periphery 211d extending in the second direction (+Y, −Y) and having the second length.

According to various embodiments, the display device 220 may be at least partially made of a material that transmits radio waves or magnetic fields. For example, the display device 220 may include a window member made of a tempered glass material and a display panel mounted on the inner surface of the window member. A touch panel may be mounted between the window member and the display device. For example, the display device 220 may be an output device for outputting a screen, and may be used as an input device equipped with a touch screen function.

According to various embodiments, the display device 220 may be exposed through the first surface 211 of the housing 210. The display device may include a first side 217 extending in the first direction (+X, −X) along the first periphery 211a of the first surface 211. The first side 217 may extend in the first direction (+X, −X) along the first periphery 211a of the first surface 211, and may be spaced apart from the first periphery 211a of the first surface 211 in the second direction (+Y, −Y) in a range of 0.1 mm to 7.0 mm. According to another embodiment, the first side 217 may extend in a range of 0.3 mm to 10.00 mm from the first periphery 211a of the first surface 211 in the second direction (+Y, −Y). According to another embodiment, the first side 217 may extend in a range of 0.1 mm to 5.00 mm from the first periphery 211a of the first surface 211 in the second direction (+Y, −Y).

According to various embodiments, the housing 210 of the electronic device 200 may include a rear cover 240 that protects the rear surface of the housing 210. The rear cover may be mounted on a side opposite the display device 220. The rear cover 240 may form the external appearance of the electronic device 200 together with the display device 220.

According to various embodiments, the flexible connectors 300 and 400 may be disposed between the housing 210 and structures 240 and 290, each of which includes a printed circuit board 250 or a radiator. For example, the one or more flexible connectors 300 and 400 may be disposed on the printed circuit board 250 to face the printed circuit board 250, and may be in contact with two or more radiation conductors that constitute the antenna. For example, at least one of the at least two radiation conductors may be a conductor or radiator that forms at least a portion of the housing 210. As another example, at least one of the two or more radiation conductors may be a radiator 201a included in the structures 240 and 290. The antenna may transmit or receive radio waves therethrough or may generate a magnetic field.

Figure 3:
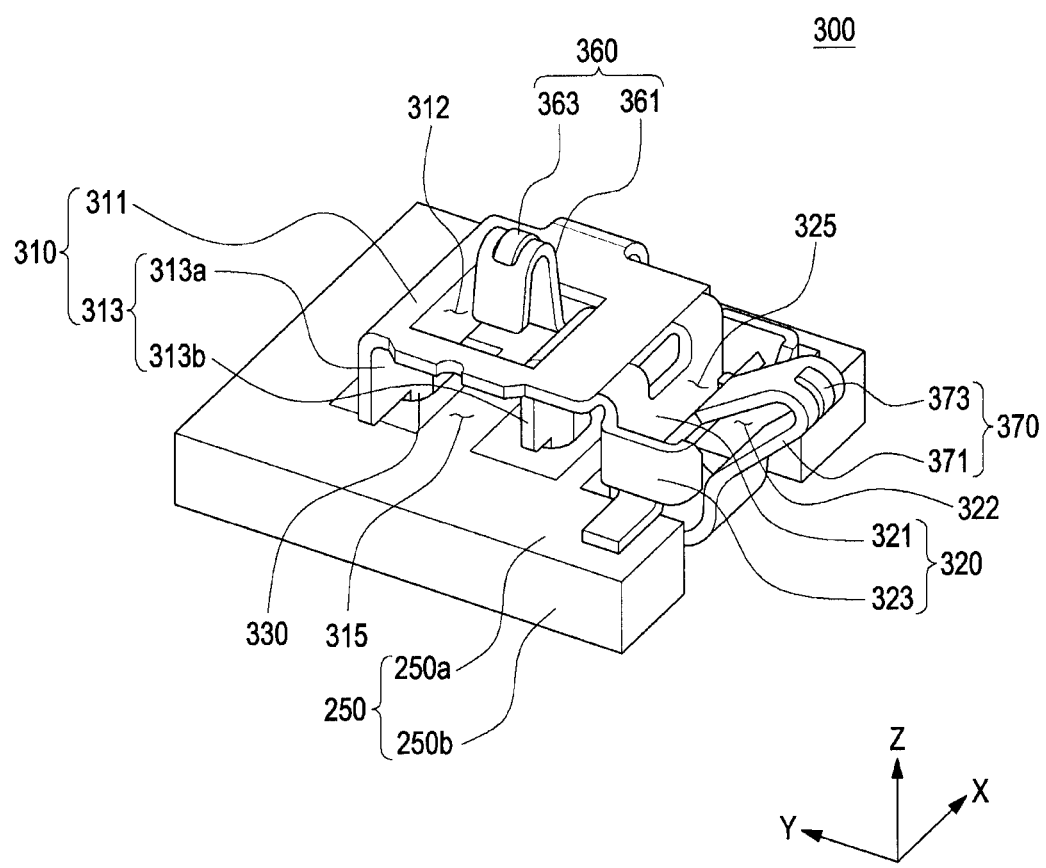
FIG. 3 is a perspective view illustrating the configuration of a flexible connector included in an electronic device according to various embodiments of the present disclosure.
Figure 4:
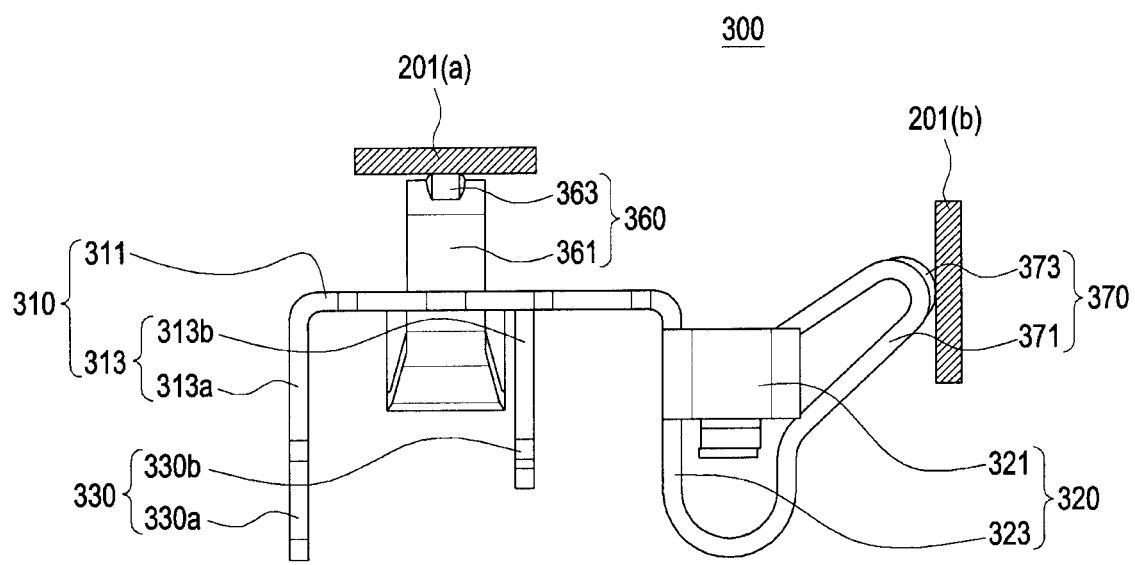
FIG. 4 is a perspective view illustrating the configuration of the flexible connector included in the electronic device according to various embodiments of the present disclosure.
Figure 5:
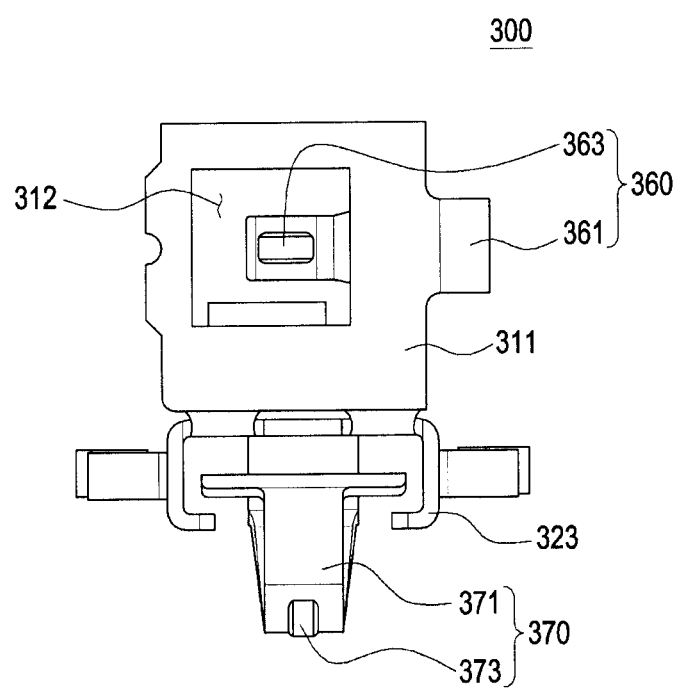
FIG. 5 is a top view illustrating the configuration of the flexible connector included in the electronic device according to various embodiments of the present disclosure.

FIG. 3 is a perspective view illustrating the configuration of a flexible connector 300 included in an electronic device according to various embodiments of the present disclosure. FIG. 4 is a side view illustrating the configuration of the flexible connector 300 included in the electronic device according to various embodiments of the present disclosure. FIG. 5 is a top view illustrating the configuration of the flexible connector 300 included in the electronic device according to various embodiments of the present disclosure.

In FIG. 3, "X", "Y", and "Z" in the triaxial orthogonal coordinate system may correspond to the directions of the triaxial orthogonal coordinate system of the electronic device 200 in FIG. 2A. In one embodiment of the present disclosure, the "X-axis direction" may be referred to as a first direction (+X, −X), and the "Y-axis direction" may be referred to as a second direction (+Y, −Y), and the "Z-axis direction" may be referred to as a third direction (+Z, −Z).

Referring to FIGS. 3 to 5, the flexible connector 300 may allow contact points to be formed between the antenna (the first radiation conductor 201a and the second radiation conductor 201b) and the printed circuit board 250. The flexible connector 300 may include a first frame 310 disposed on a first surface 250a of the printed circuit board 250. The flexible connector 300 includes a second frame 320 extending from one side of the first frame 310 and disposed on a second surface 250b different from the first surface 250a of the printed circuit board 250. The flexible connector 300 may include at least one first flexible conductive portion 360 that protrudes from the central portion of the first frame 310 and that maintains a contact point with the first radiation conductor 201a. The flexible connector 300 may include at least one second flexible conductive portion 370 that protrudes from the central portion of the second frame 320 and that maintains a contact point with the second radiation conductor 201a.

According to various embodiments, the flexible connector 300 may be built in the electronic device so as to interconnect the antenna and the printed circuit board on which various electronic components necessary for operating the electronic device such that electric signals can be smoothly transmitted. For example, the antenna may include the first radiation conductor 201a, which may use at least one of, for example, Long-Term Evolution (LTE), LTE Advanced (LTE-A), Code Division Multiple Access (CDMA), Wideband CDMA (WCDMA), Universal Mobile Telecommunication System (UMTS), Wireless Broadband (WiBro), and Global System for Mobile communication (GSM). Alternatively, the antenna may include the second radiation conductor 201b, which may use at least one of, for example, Bluetooth, Wi-Fi, Near Field Communication (NFC), and Global Navigation Satellite System (GNSS).

According to various embodiments, the first radiation conductor 201a may be at least one antenna, which is included in the structure 240 of FIG. 2, which is disposed to face the front end portion or the rear end portion of the housing 210 of the electronic device 200. In addition, the first radiation conductor 201a may be a portion of the structure 240 formed by Laser Direct Structuring (LDS). The second radiation conductor 201b may be a portion made of a metal forming at least a portion of the side portion of the housing 210 of the electronic device.

According to various embodiments, the flexible connector 300 may be formed in a single body by fabricating a first frame 310, a second frame 320, a fixing portion 330, a first flexible conductive portion 360, and a second flexible conductive 370 are formed in a coplanar state, and then bent or folded by bending or the like.

According to various embodiments, the first frame 310 and the second frame 320 may be integrally formed. The first frame 310 and the second frame 320 may be fabricated so as to be oriented in different directions (e.g., in the second direction (+Y, −Y) or the third direction (+Z, −Z)) when they are seated on the printed circuit board 250. For example, the first frame 310 may be disposed to face the first surface 250a so as to be seated on the first surface 250a of the printed circuit board 250. In addition, the second frame 320 may be disposed to face the second surface 250b so as to be seated on the second surface 250b of the printed circuit board 250.

According to various embodiments, the first surface 250a of the printed circuit board 250 may be the front portion of the printed circuit board 250 and the second surface 250b of the printed circuit board 250 may be the side portion of the printed circuit board 250. For example, the first frame 310 and the second frame 320 may be fabricated to be perpendicular to each other, and may be seated on an end portion of the printed circuit board 250 in a "¬" shape.

According to various embodiments, the first frame 310 may include an upper plate 311 and a side plate 313. For example, the first frame 310 may be a portion of a hollow rectangular parallelepiped shape having at least one open side.

According to various embodiments, the upper plate 311 may be disposed to be spaced apart from the first surface 250a of the printed circuit board 250, and may include an opening 312 through which the first flexible conductive portion 360 is movable in the third direction (+Z, −Z) by being pressed. A first space 315 in which the upper plate 311 and the first surface 250a of the printed circuit board 250 are spaced apart from each other may form an accommodation space in which at least a portion of the first flexible conductive portion 360 may be accommodated during movement. The opening 312 may be disposed in the central portion of the upper plate 311, and may be fabricated to have a hole shape corresponding to the first flexible conductive portion 360 and to have a sufficient separation distance such that at least a portion of the first flexible conductive portion 360 does not come into contact with the first surface 250a of the printed circuit board 250 while being raised or lowered due to tension.

According to various embodiments, the side plate 313 may be provided so as to at least partially enclose the first space 315 between the upper plate 311 and the first surface 250a of the printed circuit board 250. The side portion of the first frame 310 may be formed of a first side plate 313a constituting one side surface and a second side plate 313b constituting another side surface. The first side plate 313a may be formed by bending or folding one end portion of the first frame 310. The second side plate 313b may be formed by cutting the metal plate, which was positioned before forming the opening 312, and then bending the metal plate in order to form the opening 312. For example, the first side plate 313a and the second side plate 313b may be disposed to face the second frame 320.

According to various embodiments, one side of the first side plate 313a and the second side plate 313b may be in direct contact with the printed circuit board 250. For example, the one side of the first side plate 313a and the second side plate 313b may form a contact point with the printed circuit board 250 on the first surface 250a.

According to various embodiments, the first frame 310 may include a fixing portion 330 inserted into the printed circuit board 250 to prevent the flexible connector 300 from shaking. The fixing portion 330 may extend at the lower ends of the first and second side plates 313a and 313b. The fixing portion 330 may include a first fixing portion 330a disposed in the lower portion of the first side plate 313a and a second fixing portion 330b disposed in the lower portion of the second side plate 313b. For example, the fixing portion 330 may be disposed on the printed circuit board 250 by inserting the first fixing portion 330a and the second fixing portion 330b into holes formed on the first surface 250a of the printed circuit board 250, and filling the peripheral portions thereof with solder.

According to various embodiments, the connection portion between the upper plate 311 and the side plate 313 of the first frame 310 may be rounded.

According to various embodiments, the first flexible conductive portion 360 may include a first tension member 361 and a first contact member 363. For example, the first flexible conductive portion 360 may be a plate in which at least two U-shaped curved surfaces are formed.

According to various embodiments, the first tension member 361 of the first flexible conductive portion 360 may extend from the first frame 310. The first tension member 361 of the first flexible conductive portion 360 may include an elastic material such that the first tension member 361 can be raised or lowered in the third direction (+Z, −Z) depending on whether or not a contact point is formed by applying pressure or releasing pressure. For example, the first tension member 361 may extend from the end of the upper plate 311 to the first space 315 and protrudes into the opening 312 of the upper plate 311. The first tension member 361 is formed to extend from the end of the upper plate 311 to the center, and may form at least one curved surface.

According to various embodiments, at least one first contact member 363 may be disposed on the protruding surface of the first tension member 361 so as to be oriented in the third direction (+Z, −Z), and may form a contact point by coming in contact with the first radiation conductor 201a.

According to various embodiments, when the first contact member 363 is raised or lowered by the upward or downward movement of the first tension member 361, the contact point may be formed or released. The formation of the contact point may mean that the first radiation conductor 201a forms a contact point with the first contact member 363 while being lowered (in the −Z direction) from the upper side of the first contact member 363. Releasing the contact point may mean that the first radiation conductor 201a is spaced apart from the first contact member 363 while being raised (in the +Z direction) from the state of being in contact with the first contact member 363. By arranging the first flexible conductive portion 360 that provides the elastic force as described above, it is possible to stably maintain the contact point even if the contact point shakes due to the movement or impact of the electronic device 200.

According to various embodiments, the first frame 310 may stably form a contact point with the printed circuit board 250 and the first flexible conductive portion 360 extending from the first frame 310 may stably form a contact point with the first radiation conductor 201a, thereby interconnecting the antenna and the printed circuit board 250 on which various electronic components necessary for the operation of the electronic device 200 are mounted, so that electric signals can be smoothly transmitted therebetween.

According to various embodiments, the second frame 320 may include a support plate 321 and an auxiliary plate 323. For example, the second frame 320 may be a portion of a hollow rectangular parallelepiped shape having at least one open side.

According to various embodiments, the support plate 321 may form one region of the side surface of the first frame 310 while being disposed to face the side plate 313 of the first frame 310. The support plate 321 may extend vertically downward (−Z direction) from the upper plate 311 of the first frame 310 so as to support the second frame 320 as a whole. The support plate 321 may form a contact point with the printed circuit board 250 on the second surface 250b.

According to various embodiments, the auxiliary plate 323 may extend from the opposite ends of the support plate 321 and may be formed to surround an opening 322 through which the second flexible conductive portion 370 is movable in the second direction (+Y, −Y) by being pressed. A second space 325 inside the support plate 321 and the auxiliary plate 323 may form an accommodation space in which at least a portion of the second flexible conductive portion 370 can be accommodated when the second flexible conductive portion 370 moves. The second space 325 may prevent the second flexible conductive portion 370 and the second surface 250b of the printed circuit board 250 from coming in contact with each other. The opening 322 may be disposed to face the support plate 321, and may be fabricated to have a shape corresponding to the second flexible conductive portion 370 and to have a sufficient separation distance such that at least a portion of the second flexible conductive portion 370 does not come into contact with the second surface 250b of the printed circuit board 250 while being raised or lowered due to tension.

According to various embodiments, the auxiliary plate 323 may extend vertically from the opposite ends of the support plate 321 and may extend from one end of the printed circuit board 250 by the length of the second radiation conductor 201b. As another example, the movement distance of the second flexible conductive portion 370 in the second direction (+Y, −Y) may be limited depending on the length of the auxiliary plate 323.

According to various embodiments, the printed circuit board 250 may include a recessed structure corresponding to the support plate 321 of the second frame 320, so that the second frame 320 can be seated at one end of the printed circuit board 250. Since a plurality of flexible connectors 300 may be disposed at one end of the printed circuit board 250, a plurality of recesses may be correspondingly formed in the printed circuit board 250.

According to various embodiments, the connection portion between the upper plate 321 and the side plate 323 of the second frame 320 may be rounded.

According to various embodiments, the second flexible conductive portion 370 may include a second tension member 371 and a second contact member 373. For example, the second flexible conductive portion 370 may have a line shape in which two or more U-shaped curved surfaces are formed.

According to various embodiments, the second tension member 371 may extend from the second frame 320. The second tension member 371 of the second flexible conductive portion 370 may include an elastic material such that the second tension member 361 can be raised or lowered depending on whether or not a contact point is formed by being pressed. For example, the second tension member 371 may extend from the end of the support plate 321 to the second space 325 and protrudes into the opening 322 of the second auxiliary plate 323. The second tension member 371 is formed to extend from the end of the support plate 321 to the center of the second frame 320, and may form at least one curved surface.

According to various embodiments, at least one second contact member 373 may be disposed on the protruding surface of the second tension member 371 so as to be oriented in the second direction (+Y, −Y). The second contact member 373 may form a contact point by coming in contact with second radiation conductor 201b.

According to various embodiments, when the second contact member 373 is also raised or lowered in the second direction (+Y, −Y) by the upward or downward movement of the second tension member 371 in the second direction (+Y, −Y), the contact point may be formed or released. The formation of the contact point may mean that the second radiation conductor 201b forms a contact point with the second contact member 373 while moving from the outside to the inside of the second contact member 373. Releasing the contact point may mean that the second radiation conductor 201b is spaced apart from the second contact member 373 while moving outwards from the state of being in contact with second first contact member 373.

According to various embodiments, by arranging the second flexible conductive portion 370 described above, it is possible to stably maintain the contact point even if the contact point shakes due to the movement or impact of the electronic device 200.

According to various embodiments, the second frame 320 may stably form a contact point with the printed circuit board 250 and the second flexible conductive portion 370 extending from the second frame 320 may stably form a contact point with the second radiation conductor 201b, thereby interconnecting the antenna and the printed circuit board 250 on which various electronic components necessary for operating the electronic device 200 are mounted, so that electric signals can be smoothly transmitted therebetween.

Figure 6:
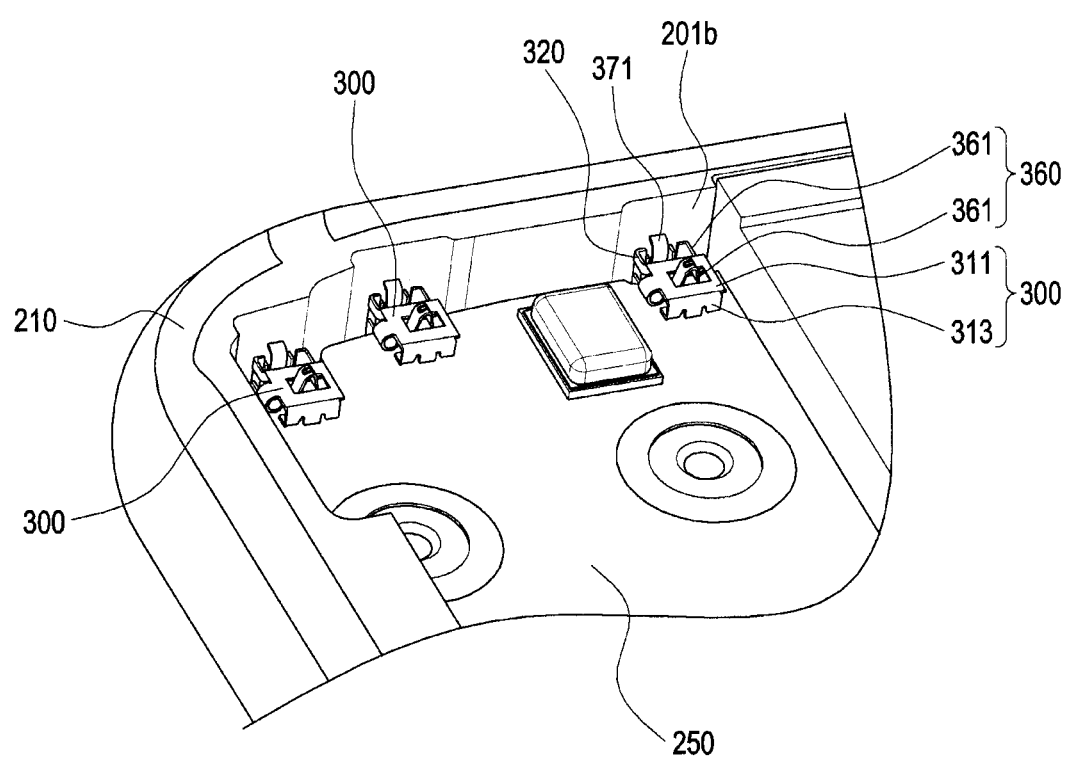
FIG. 6 is a perspective view illustrating flexible connectors mounted in an electronic device according to an embodiment of the present disclosure.
Figure 7:
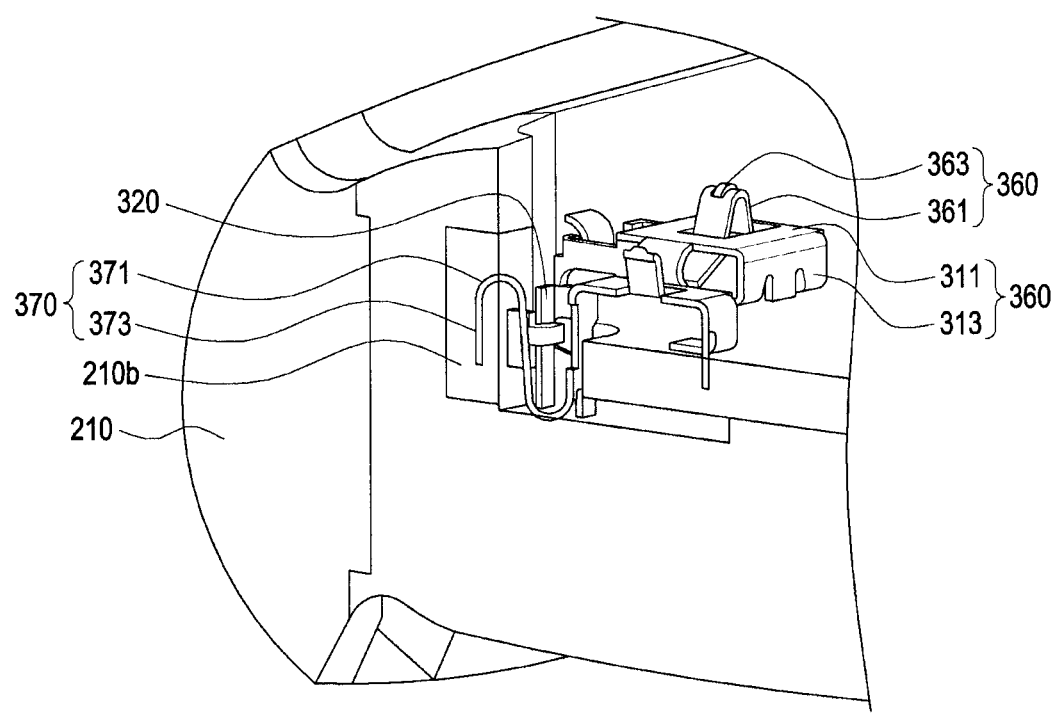
FIG. 7 is a cross-sectional view taken by cutting the central portion of a flexible connector mounted in an electronic device according to an embodiment of the present disclosure.

FIG. 6 is a perspective view illustrating flexible connectors 300 mounted in an electronic device according to an embodiment of the present disclosure. FIG. 7 is a cross-sectional view taken by cutting the central portion of a flexible connector 300 mounted in an electronic device according to an embodiment of the present disclosure.

Referring to FIGS. 6 and 7, each flexible connector 300 may be disposed in a corner region of the printed circuit board 250 so as to form contact points with a radiator. For example, the first connection member 363 on the first frame 310 disposed at the upper side of the flexible connector 300 protrudes in the third direction (+Z, −Z) so as to form a contact point to be in contact with the first radiation conductor 201a illustrated in FIG. 4. The second contact member 373 on the second frame 320 disposed on a side surface protrudes in the second direction (+Y, −Y) so as to form a contact point to be in contact with the second radiation conductor 201b illustrated in FIG. 4.

According to various embodiments, the first flexible conductive portion 360 may include a first tension member 361 made of an elastic material. The first tension member 361 may assist electrical connection by maintaining tension in the third direction (+Z, −Z) such that the contact pint of an internal structure of the electronic device 200 can be continuously maintained in the third direction (+Z, −Z). The second flexible conductive portion 370, which forms a contact point with the second radiation conductor 201b formed as a portion of the side surface of the electronic device 200, may include a second tension member 371 made of an elastic material. The second tension member 371 may assist electrical connection by maintaining tension in the second direction (+Y, −Y) such that the contact point of an internal structure of the electronic device 200 can be maintained in the second direction (+Y, −Y).

According to various embodiments, the outer surface of the first flexible conductive portion 360 or the second flexible conductive portion 370 of the flexible connector 300 may be plated so as to prevent corrosion. For example, the housing 210 may be made of a material including aluminum, and the flexible connector 300 may be made of a material including copper. For example, a portion of the flexible connector 300 (a portion of the first flexible conductive portion 360 or the second flexible conductive portion 370) may be plated so as to prevent corrosion.

According to various embodiments, the flexible connector 300 may be coupled to the printed circuit board 250, and may stably maintain a contact point with the antenna (the first radiation conductor 201a and the second radiation conductor 201b). For example, referring to FIG. 2, even if the display 220 is fabricated in a size with which the display 220 is located close to the end portion of the printed circuit board 250, which faces the display disposed on the upper side thereof, the separation distance from the antenna is secured, so that an interference phenomenon can be suppressed so as to implement the normal radiation of the antenna.

Figure 8A:
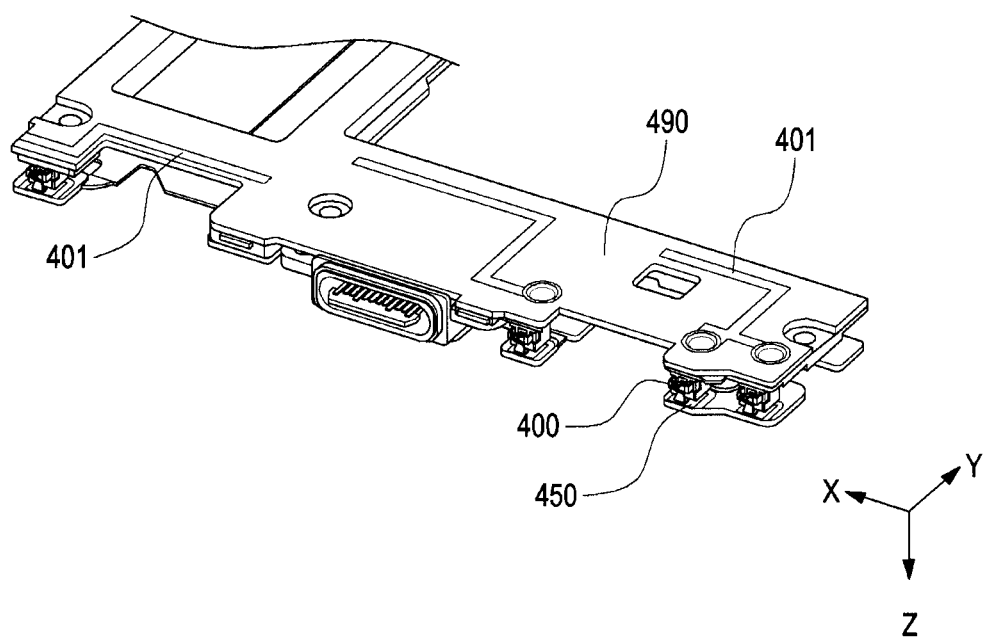
FIGS. 8A and 8B are perspective views illustrating flexible connectors mounted in an electronic device according to another embodiment of the present disclosure.
Figure 8B:
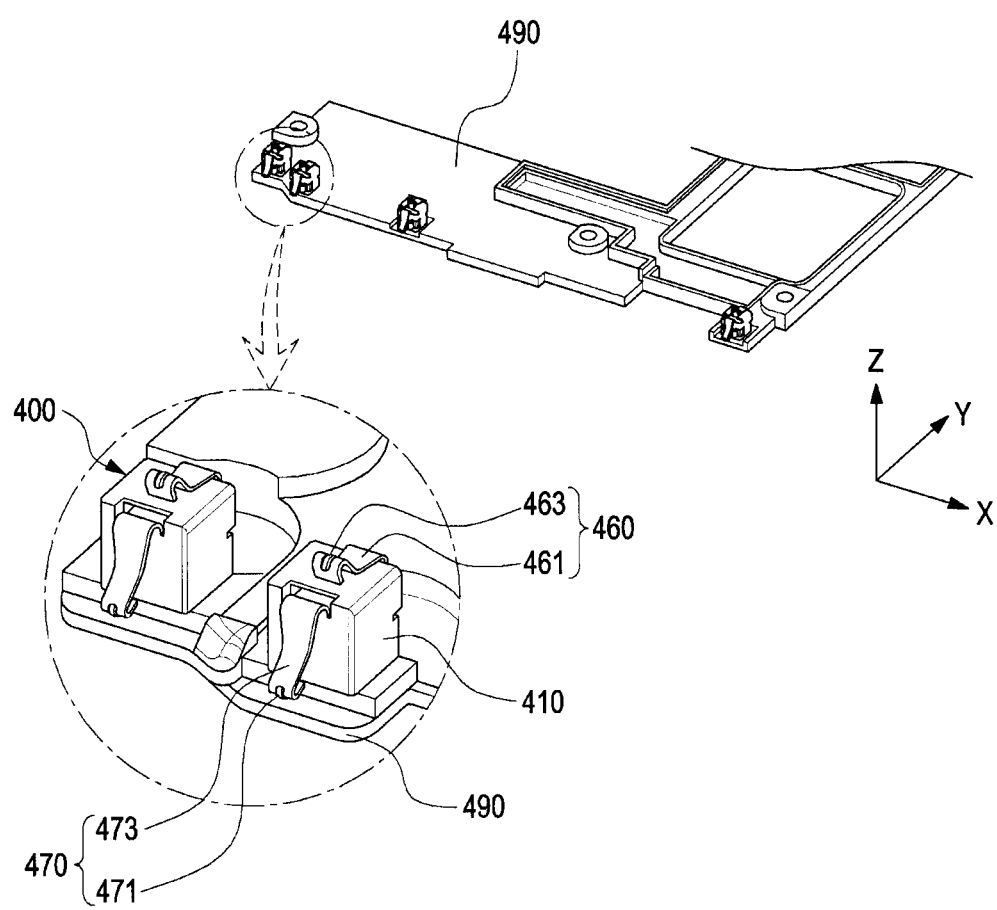

FIGS. 8A and 8B are a perspective view and an enlarged view illustrating flexible connectors 400 mounted in an electronic device according to another embodiment of the present disclosure. In FIG. 8, "X", "Y", and "Z" in the triaxial orthogonal coordinate system may correspond to the directions of the triaxial orthogonal coordinate system of the electronic device 200 in FIG. 2A. In one embodiment of the present disclosure, the "X-axis direction" may be referred to as a first direction (+X, −X), the "Y-axis direction" may be referred to as a second direction (+Y, −Y), and the "Z-axis direction" may be referred to as a third direction (+Z, −Z). A printed circuit board 450, a structure including a radiator 490, and radiation conductors 401 illustrated in FIG. 8 may be at least a portion of the printed circuit board 250, the structure 290 including a radiator, and the radiation conductors 201a and 201b of FIG. 2A.

According to various embodiments, each flexible connector 400 may be fastened to a structure including the radiation conductor 401. A first contact member 463 on a frame 410 disposed in the flexible connector 400 may be disposed to be oriented in the third direction (+Z, −Z) so as to form a contact point to be in contact with the surface of the printed circuit board 450. A second contact member 473 on the frame 410 disposed in the flexible connector 400 may be disposed to be oriented in the second direction (+Y, −Y) so as to form a contact point to be in contact with at least a portion of the radiation conductor formed on the side surface of the electronic device.

According to various embodiments, the first flexible conductive portion 460, which forms a contact point with the flexible printed circuit board 450, may include a first tension member 461 made of an elastic material. The first tension member 461 may assist electrical connection by maintaining tension in the third direction (+Z, −Z) such that the contact point of an internal structure of the electronic device can be continuously maintained in the third direction (+Z, −Z). In addition, the second flexible conductive portion 470, which forms a contact point with at least a portion of a radiating conductor formed of a portion of the side surface of the electronic device 200, may include a second tension member 471 made of an elastic material. The second tension member 471 may assist electrical connection by maintaining tension in the second direction (+Y, −Y) such that the contact point of an internal structure of the electronic device 200 can be maintained in the second direction (+Y, −Y).

According to various embodiments, the outer surface of a metal housing, which is connected to at least one of the first flexible conductive portion 460 and the second flexible conductive portion 470 of the flexible connector 400, may be plated so as to prevent corrosion. For example, the outer surface of the housing 210 may be made of a material including aluminum, and the flexible connector 400 may be made of a material including copper. In this case, it is possible to prevent corrosion, which is caused by the contact of the two different metals, by plating a portion of the outer surface of the housing.

According to various embodiments, even if the display 220 disposed in the electronic device 200 illustrated in FIG. 2 is fabricated in a size with which the display 220 is located close to the end portion of the printed circuit board 450, which faces the display 220, the separation distance is secured between the display 220 and the antenna during the use of the flexible connector 400, so that an interference phenomenon due to overlapping can be suppressed. For example, the flexible connector 400 may be coupled to at least a portion of the radiation conductor 401 or the printed circuit board 450 and may stably maintain a contact point with the radiation conductor 401 or the printed circuit board 450. Thus, the display may be implemented in a size with which the display is located close to the end of the printed circuit board 450.

Figure 9:
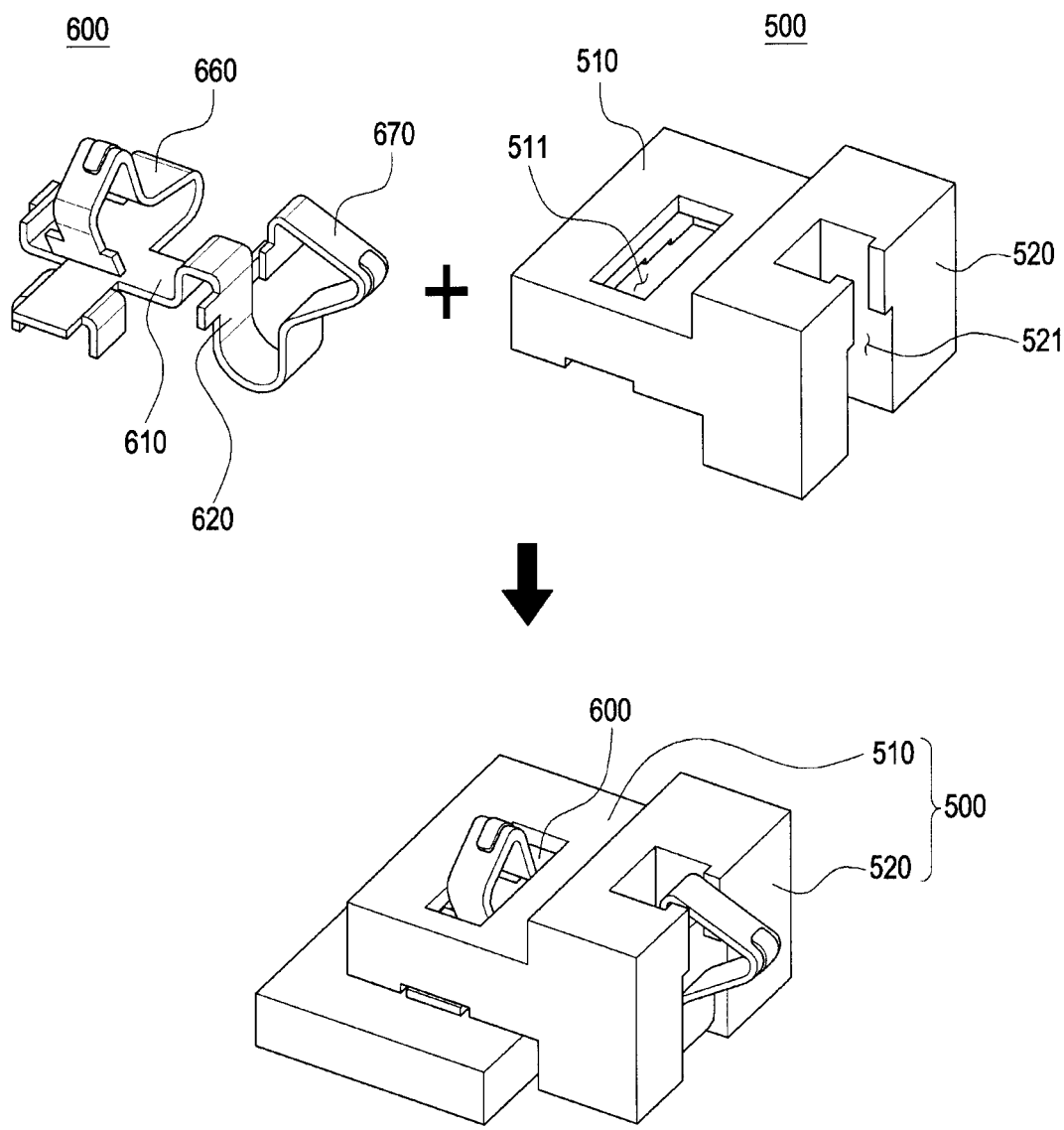
FIG. 9 is a perspective view illustrating the assembled state of a flexible connector and a cover unit that covers the flexible connector according to various embodiments of the present disclosure.

FIG. 9 is a perspective view illustrating the assembled state of a flexible connector and a cover unit 500 that covers the flexible connector according to various embodiments of the present disclosure.

Referring to FIG. 9, a flexible connector 600 may allow contact points to be formed between an antenna (e.g., the first radiation conductor 201a and the second radiation conductor 201b illustrated in FIG. 2) and the printed circuit board 250 illustrated in FIG. 2. The flexible connector 600 may be implemented by replacing the regions of the upper plate 311 and the second frame 320 with the cover unit 500 in the structure of the flexible connector 300 illustrated in FIG. 3. According to various embodiments, the flexible connector 600 and the cover part 500 may be disposed on the printed circuit board in the assembled state to maintain contact points with the first and second radiation conductors.

According to various embodiments, the flexible connector 600 may include a first frame 610 and a plate-shaped second frame 620 extending in a vertical direction from one side of the first frame 610 so as to form the contact points. The flexible connector 600 may include at least one first flexible conductive portion 660 that protrudes from the central portion of the first frame 610 and that maintains a contact point with the antenna or the printed circuit board. The flexible connector 600 may include at least one second flexible conductive portion 670 that protrudes from the central portion of the second frame 620 and that maintains a contact point with the antenna or the printed circuit board.

According to various embodiments, the cover unit 500, which covers the flexible connector 600, may include a first cover 510 opened so as to allow a portion of the first flexible conductive portion 660 of the first frame 610 to form a contact point while moving in the third direction (+Z, −Z) therethrough, and a second cover 520 opened to allow a portion of the second flexible conductive portion 670 of the second frame to form a contact point while moving in the second direction (+Y, −Y) therethrough.

According to various embodiments, the first cover 510 may be manufactured to cover the upper surface of the first frame 610 and to have an opening 511 disposed in the center thereof so as not to disturb the movement of a portion of the first flexible conductive portion 660. The first cover 510 may be manufactured through injection molding. The first cover 510 may prevent deformation of the flexible connector 600.

According to various embodiments, the second cover 520 may be manufactured to cover the exposed surface of the second frame 620 and to have an opening 521 disposed in the center thereof so as not to disturb the movement of a portion of the second flexible conductive portion 670. The second cover 520 may be manufactured through injection molding. The second cover 520 may prevent deformation of the flexible connector 600.

According to an embodiment of the present disclosure, an electronic device may include: a first housing including a first surface, a second surface facing away from the first surface, and a side surface surrounding a space between the first surface and the second surface, at least a portion of the side surface being formed of an electrically conductive material and the first surface having a substantially rectangular shape when viewed from above, in which the rectangular shape includes a first periphery extending in a first direction and having a first length, a second periphery extending in a second direction perpendicular to the first direction and having a second length longer than the first length, a third periphery extending in the first direction and having the first length, and a fourth periphery extending in the second direction and having the second length;

a touch screen display exposed through the first surface and including a first side extending in the first direction along the first periphery of the first surface, the first side extending in a range of 0.1 mm to 10.00 mm from the first periphery of the first surface in the second direction;

a printed circuit board disposed between the touch screen display and the second surface, and having at least one conductive path; and a flexible connector disposed to provide an electrical connection between the at least one conductive path and at least a portion of the side surface, wherein the connector may include a first conductive portion configured to be movable in the second direction and disposed to be in electrical contact with the at least a portion of the side surface, and a second conductive portion configured to be movable in the third direction perpendicular to the first direction and the second direction.

According to an embodiment of the present disclosure, the first side may extend in a range of 0.1 mm to 7.0 mm from the first periphery of the first surface in the second direction.

According to an embodiment of the present disclosure, the first side may extend in a range of 0.1 mm to 5.0 mm from the first periphery of the first surface in the second direction.

According to an embodiment of the present disclosure, an electronic device may include: a first housing including a first surface, a second surface facing away from the first surface, and a side surface surrounding a space between the first surface and the second surface, at least a portion of the side surface being formed of an electrically conductive material and the first surface having a substantially rectangular shape when viewed from above, in which the rectangular shape includes a first periphery extending in a first direction and having a first length, a second periphery extending in a second direction perpendicular to the first direction and having a second length longer than the first length, a third periphery extending in the first direction and having the first length, and a fourth periphery extending in the second direction and having the second length;

a touch screen display exposed through the first surface and including a first side extending in the first direction along the first periphery of the first surface;

a printed circuit board disposed between the touch screen display and the second surface, and having at least one conductive path; and a flexible connector disposed to provide an electrical connection between the at least one conductive path and at least a portion of the side surface, wherein the connector may include a first conductive portion configured to be movable in the second direction and disposed to be in electrical contact with the at least a portion of the side surface, and a second conductive portion configured to be movable in the third direction perpendicular to the first direction and the second direction.

According to an embodiment of the present disclosure, when viewed from above the first surface, the electrical contact between the first conductive portion and the at least a portion of the side surface may not overlap the display.

According to an embodiment of the present disclosure, the electronic device may further include a first radiation conductor disposed to face the first periphery or the third periphery and a second radiation conductor formed of an electrically conductive material of the side surface of the electronic device, and the flexible connector may further include a first frame disposed to face a first surface of the printed circuit board and a second frame extending from one side of the first frame.

According to an embodiment of the present disclosure, the first conductive portion may protrude on a central portion of the first frame and maintain a contact point with the first radiation conductor or the printed circuit board, and the second conductive portion may protrude on a central portion of the second frame and maintain a contact point with the second radiation conductor.

According to an embodiment of the present disclosure, the first conductive portion may include: a first tension member extending from the first frame and configured to be raised or lowered in the third direction depending on whether a contact point is formed by applying pressure or the contact point is released by releasing pressure; and at least one first contact member disposed on a protruding surface of the first tension member to be oriented in the third direction and configured to be in contact with the first radiation conductor or the printed circuit board so as to form an electrical contact point.

According to an embodiment of the present disclosure, the second conductive portion may include: a second tension member extending from the second frame and configured to be raised or lowered in the second direction depending on whether a contact point is formed by applying pressure or the contact point is released by releasing pressure; and at least one second contact member disposed on a protruding surface of the second tension member to be oriented in the second direction and configured to be in contact with the second radiation conductor so as to form an electrical contact point.

According to an embodiment of the present disclosure, the first frame may include: a side plate disposed in contact with the first surface of the printed circuit board and configured to support the first frame; and an upper plate extending upwards from the side plate, and including an opening that provides a passage that allows the first flexible conductive portion to move in the third direction therethrough when the first flexible conductive portion is pressed.

According to an embodiment of the present disclosure, the at least a portion of the first tension member may move through the opening and may be accommodated in a first space formed by the upper plate and a plurality of side plates when the first contact member is pressed.

According to an embodiment of the present disclosure, the second frame may include: a support plate extending downwards from an end of the upper plate of the first frame so as to support the second conductive portion; and an auxiliary plate disposed at opposite sides of the support plate in the second direction, and forming a second space in which at least a portion of the second conductive portion is accommodated by being pressed.

According to an embodiment of the present disclosure, one surface of the support plate may form a contact point by coming in contact with a second surface of the printed circuit board disposed perpendicular to the first surface of the printed circuit board.

According to an embodiment of the present disclosure, the at least a portion of the second tension member may move in the second direction to be accommodated in the second space when the second contact member is pressed.

According to an embodiment of the present disclosure, the first frame and the second frame may be perpendicular to each other, and the first contact member disposed on the first frame to protrude in the third direction and the second contact member disposed on the second frame to protrude in the second direction may be disposed to be perpendicular to each other.

According to an embodiment of the present disclosure, at least one fixing portion disposed parallel to the second frame may be provided at the lower end of the side plate of the first frame, and the at least one fixing portion may be inserted inside the printed circuit board so as to prevent the fixing connector from shaking.

According to an embodiment of the present disclosure, the electronic device may further include a cover unit configured to cover the outer surface of the flexible connector. The cover unit may include: a first cover disposed on the first frame and having an opening formed in the third direction in a center thereof such that the first flexible conductive portion is exposed therethrough; and a second cover disposed on the second frame and having an opening formed in the second direction in a center thereof such that the second flexible conductive portion is exposed therethrough.

According to an embodiment of the present disclosure, the outer surfaces of the first flexible conductive portion and the second flexible conductive portion may be plated.

According to an embodiment of the present disclosure, the flexible connector may include: a first frame disposed to face a first surface of a printed circuit board of an electronic device; a second frame extending from a side of the of the first frame; at least one first flexible conductive portion protruding on a central portion of the first frame, and configured to maintain a contact point with a first radiation conductor disposed on the print circuit board or inside the electronic device; and at least one second flexible conductive portion protruding on a central portion of the second frame, and configured to maintain a contact point with a second radiation conductor disposed on a side surface of the electronic device.

While the present disclosure has been shown and described with reference to certain embodiments thereof, it will be apparent to those skilled in the art that the camera lens module according to the present disclosure is not limited to these embodiments, and various changes in form and details may be made therein without departing from the spirit and scope of the present disclosure as defined by the appended claims.

The invention claimed is:
1. An electronic device, comprising:
a housing including a first surface, a second surface facing away from the first surface, and a side surface surrounding a space between the first surface and the second surface, at least a portion of the side surface being formed of an electrically conductive material;
a touch screen display exposed through the first surface, and including a first side extending along at least one periphery extending in the first direction or a second direction perpendicular to the first direction of the first surface;
a printed circuit board (PCB) disposed between the touch screen display and the second surface, and including at least one conductive path;
a first radiation conductor disposed between the PCB and the second surface of the housing; and
a flexible connector positioned to provide an electrical connection between the at least one conductive path of the PCB and at least a portion of the side surface of the housing, wherein the flexible connector includes:
a first conductive portion configured to be movable in a third direction perpendicular to the first direction and the second direction and disposed to electrically contact with the first radiation conductor, and
a second conductive portion configured to be movable in the second direction and disposed to electrically contact with the at least a portion of the side surface of the housing.

2. The electronic device of claim 1, wherein the first side extends in a range of 0.1 mm to 7.0 mm from a first periphery extending in the first direction of the first surface in the second direction.

3. The electronic device of claim 1, wherein the first side extends in a range of 0.1 mm to 5.0 mm from a first periphery extending in the first direction of the first surface in the second direction.

4. The electronic device of claim 1, wherein, when viewed from above the first surface, a electrical contact between the second conductive portion and the at least a portion of the side surface does not overlap the display.

5. The electronic device of claim 1, further comprising:
a second radiation conductor formed of an electrically conductive material of the side surface of the electronic device,
wherein the flexible connector further includes a first frame disposed to face a first surface of the printed circuit board and a second frame extending from one side of the first frame.

6. The electronic device of claim 5, wherein the first conductive portion protrudes on a central portion of the first frame and maintains a contact point with the first radiation conductor or the printed circuit board, and
the second conductive portion protrudes on a central portion of the second frame and maintains a contact point with the second radiation conductor.

7. The electronic device of claim 6, wherein the first conductive portion includes;
a first tension member extending from the first frame and configured to be raised or lowered in the third direction depending on whether a contact point is formed by applying pressure or the contact point is released by releasing pressure; and
at least one first contact member disposed on a protruding surface of the first tension member to be oriented in the third direction and configured to be in contact with the first radiation conductor or the printed circuit board so as to form an electrical contact point.

8. The electronic device of claim 7, wherein the second conductive portion includes:
a second tension member extending from the second frame and configured to be raised or lowered in the second direction depending on whether a contact point is formed by applying pressure or the contact point is released by releasing pressure; and
at least one second contact member disposed on a protruding surface of the second tension member to be oriented in the second direction and configured to be in contact with the second radiation conductor so as to form an electrical contact point.

9. The electronic device of claim 8, wherein the first frame includes:
a side plate disposed in contact with the first surface of the printed circuit board and configured to support the first frame; and
a flexible connector including an upper plate extending upwards from the side plate, and including an opening that provides a passage that allows a first flexible conductive portion to move in the third direction therethrough when the first flexible conductive portion is pressed,
wherein the at least a portion of the first tension member moves through the opening and is accommodated in a first space formed by the upper plate and a plurality of side plates when the first contact member is pressed.

10. The electronic device of claim 9, wherein the second frame includes:
a support plate extending downwards from an end of the upper plate of the first frame so as to support the second conductive portion; and
an auxiliary plate disposed at opposite sides of the support plate in the second direction, and forming a second space in which at least a portion of the second conductive portion is accommodated in the second direction by being pressed,
wherein one surface of the support plate forms a contact point by being in contact with a second surface of the printed circuit board disposed perpendicular to the first surface of the printed circuit board.

11. The electronic device of claim 10, wherein the at least a portion of the second tension member moves in the second direction to be accommodated in the second space when the second contact member is pressed.

12. The electronic device of claim 11, wherein the first frame and the second frame are perpendicular to each other, and the first contact member disposed on the first frame to protrude in the third direction and the second contact member disposed on the second frame to protrude in the second direction are disposed to be perpendicular to each other.

13. The electronic device of claim 9, wherein at least one fixing portion disposed parallel to the second frame is provided at the lower end of the side plate of the first frame, and
the at least one fixing portion is inserted inside the printed circuit board so as to prevent the flexible connector from shaking.

14. The electronic device of claim 8, further comprising:
a cover unit configured to cover an outer surface of the flexible connector,
wherein the cover unit includes:
a first cover disposed on the first frame and having an opening formed in the third direction in a center thereof such that a first flexible conductive portion is exposed therethrough; and
a second cover disposed on the second frame and having an opening formed in the second direction in a center thereof such that a second flexible conductive portion is exposed therethrough.

15. The electronic device of claim 7, wherein outer surfaces of a first flexible conductive portion and a second flexible conductive portion are plated.

* * * * *